United States Patent [19]

Knight et al.

[11] 4,048,597

[45] Sept. 13, 1977

[54] PLANAR PRINTED CIRCUIT BOARD ARRANGEMENT USEFUL IN THE UHF PORTION OF A TELEVISION TUNER

[75] Inventors: Stanley Paul Knight, Cranbury, N.J.; Thomas Edward Molinari, Indianapolis, Ind.

[73] Assignee: RCA Corporation, New York, N.Y.

[21] Appl. No.: 700,121

[22] Filed: June 28, 1976

[51] Int. Cl.² ............................................. H03J 3/18
[52] U.S. Cl. ................................. 334/15; 333/84 M; 334/45; 334/71
[58] Field of Search ...................... 334/15, 41, 45, 71; 333/10, 73 S, 70 S, 84 M; 325/462, 464, 465

[56] References Cited

U.S. PATENT DOCUMENTS

| | | | |
|---|---|---|---|
| 2,468,151 | 4/1949 | Willoughby | 333/84 M X |
| 2,867,782 | 1/1959 | Arditi | 333/84 M X |
| 2,951,218 | 8/1960 | Arditi | 333/84 M X |
| 2,984,802 | 5/1961 | Dyer et al. | 333/73 S |
| 3,806,844 | 4/1974 | Buckley et al. | 334/15 |

*Primary Examiner*—Paul L. Gensler
*Attorney, Agent, or Firm*—Eugene M. Whitacre; Kenneth R. Schaefer; Peter M. Emanuel

[57] ABSTRACT

A tuner for a television receiver comprises a circuit board formed by a slab of dielectric material having conductors located on one side and discrete components mounted on the other so that it may be readily assembled and soldered. Some of the conductors are arranged to form capacitors and distributed parameter inductors. In the UHF portion of the tuner a strip-like conductor and a wider ground conductor are spaced apart in parallel relationship. The length of the gap between the strip-like conductor and the ground conductor is selected to provide inductive reactance in the UHF band. A slot is cut, punched or otherwise formed through the dielectric material in the gap between the strip-like conductor and the ground conductor to increase the Q (the figure of merit inversely related to loss) of the inductor at the upper end of the UHF range. In addition, the slot significantly improves thermal stability of the inductor. Furthermore, the combination of the slot associated with the inductor and another slot utilized to mount a varactor diode, coupled to the inductor to form a tuned circuit, determines the length of the gap. In a preferred arrangement, the two slots are punched by a unitary die to minimize the variation of inductance values from one tuner to another due to registration errors.

10 Claims, 3 Drawing Figures

PLANAR PRINTED CIRCUIT BOARD ARRANGEMENT USEFUL IN THE UHF PORTION OF A TELEVISION TUNER

The present invention relates to the field of tuners for television receivers and particularly relates to structures for forming UHF television tuners.

A variety of syructures are known for forming VHF and UHF tuners. In U.S. Pat. No. 3,806,844 entitlted, "UHF Varactor Tuner Having A Chassis Of Untiary Construction", one such tuner is shown in which distributed parameter inductors and capacitors for the UHF portion of the tuner are formed by punching portions out of a metal chassis.

The formation of coplanar distributed parameter reactive components is described in U.S. Reissure Patent 27,755 entitled, "Surface Strip Transmission Line and Microwave Device Using Same," and in an article entitled, "Computation of Coplanar-Type Strip-Line Characteristics by Relaxation Method and Its Application to Microwave Circuits", by T. Hatsuda appearing in IEEE Transactions on Microwave Theroy and Techniques, Volume MTT-23, No. 10, October 1975.

So-called printed circuits, and particularly single-sided printed circuit boards (i.e., printed circuit boards having conductors mounted only on one side), are particularly suitable for use in tuners since they offer reduced material cost, reduced assembly time and improved consistency of manufacture. Moreover, changes to printed circuit board types of tuners can be readily made from model to model by changing the photographic mask defining the conductor pattern of the printed circuit board.

In accordance with the present invention, a tuner comprises a circuit board formed of a dielectric material having conductors mounted on one side thereof. A strip-like conductor, having appropriate length to provide an inductive reactance characteristic in the UHF band, is positioned in a spaced and parallel relationship with a relatively wider conductor coupled to a source of fixed potential such as ground. A slot through the dielectric material between the strip-like conductor and the ground conductor increases the Q loss (figure of merit) at the upper end of the UHF band and additionally provides relative thermal stability.

In accordance with another feature of the present invention, a discrete element such as, for example, a varactor tuning diode, is mounted in a slot positioned with respect to the slot associated with the UHF inductor to defined the length of the strip-like conductor.

In accordance with still another feature of the present invention, a tab is mounted on the circuit board in proximity to the strip-like conductor and slot. The tab is angularly positioned with respect to the plane of the circuit board to trim the inductance of the UHF inductor.

In the accompanying drawing.

In the drawing, the same reference numbers in different figures refer to similar elements.

Figure 1:
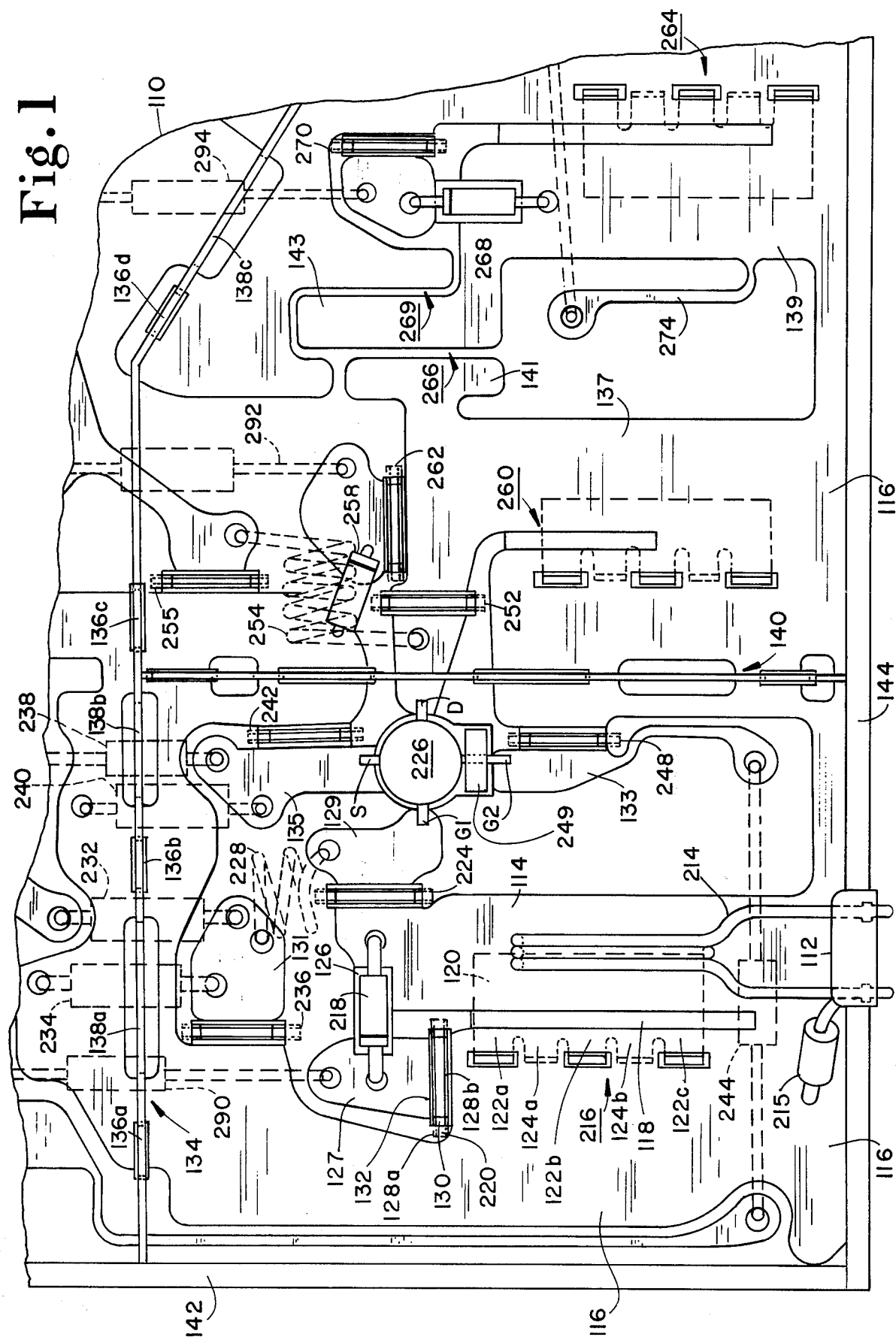
FIG. 1 is a plan view of a portion of a printed circuit board tuner constructed in accordance with the present invention.
Figure 3:
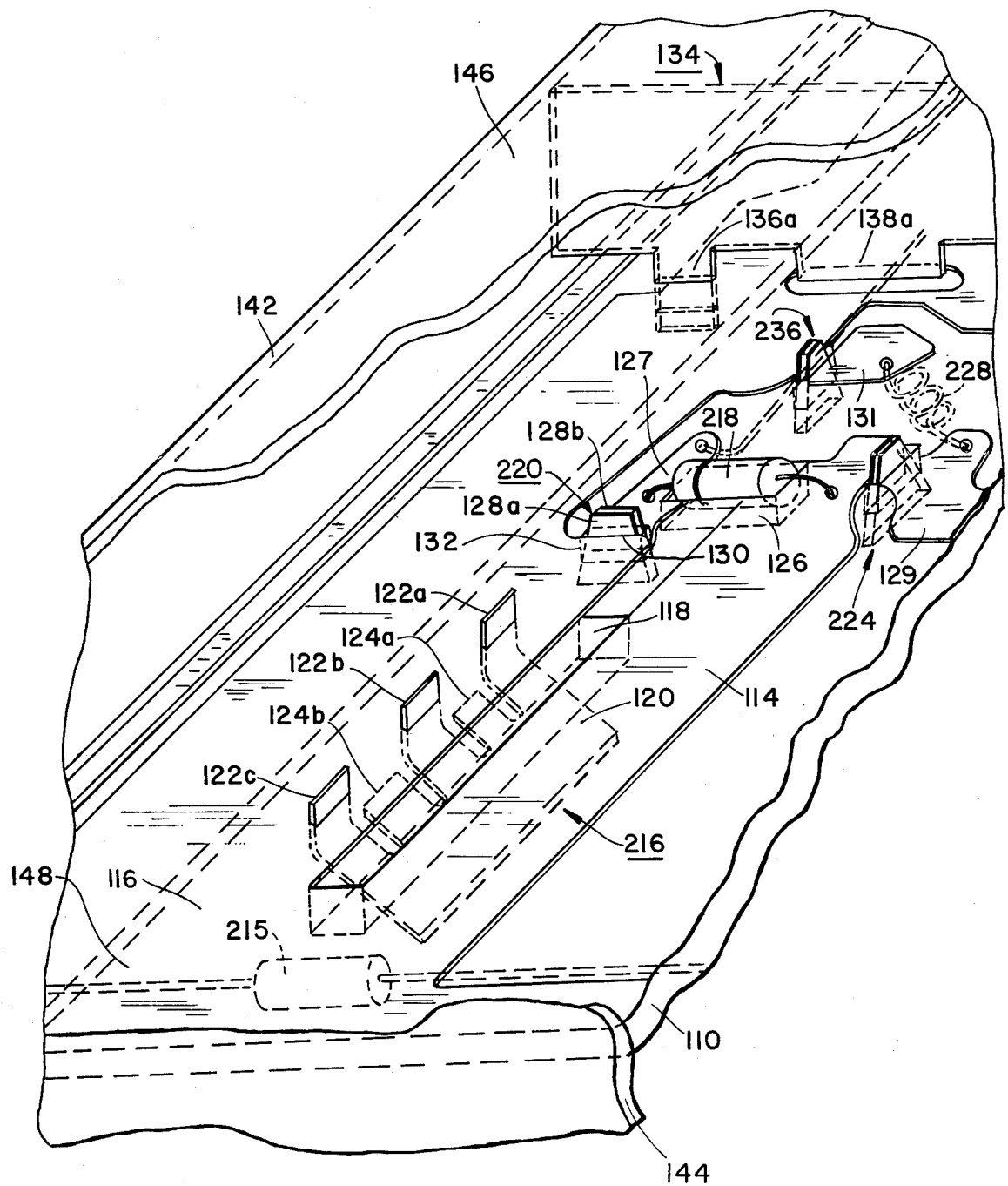
FIG. 3 is an isometric view of a fragmentated portion of the printed circuit of FIG. 1.

Referring to the drawing, and particularly to FIGS. 1 and 3, a tuner of a television receiver includes a printed circuit board 110 comprising conductors mounted on one side (i.e., the upward facing side in FIG. 1) of a slab of dielectric material to form what is commonly known as a single-sided printed circuit board. One relatively large area conductor 116 forms a ground plane. Various other conductors are coplanarly positioned with respect to ground conductor 116 to form distributed parameter inductors and capacitors. Certain discrete elements (e.g. indicated by reference numerals 228, 254, etc. and shown by dotted lines) are mounted on the side of board 110, hereinafter called the components side, opposite the side on which the conductors such as 116 are mounted. Certain other discrete components (e.g. 218) are mounted in slots (e.g. 126) which extend through the board 110. The discrete components have leads soldered to conductors on the conductor side of board 110 which interconnect the various parts of the tuner. Holes are provided in board 110 by which leads of the discrete components may be coupled to the conductors. In the diagram, solder connections or joints are not shown for the sake of clarity. However, it should be recognized that the illustrated arrangement is suitable for wave sodering of components to the board.

Figure 2:
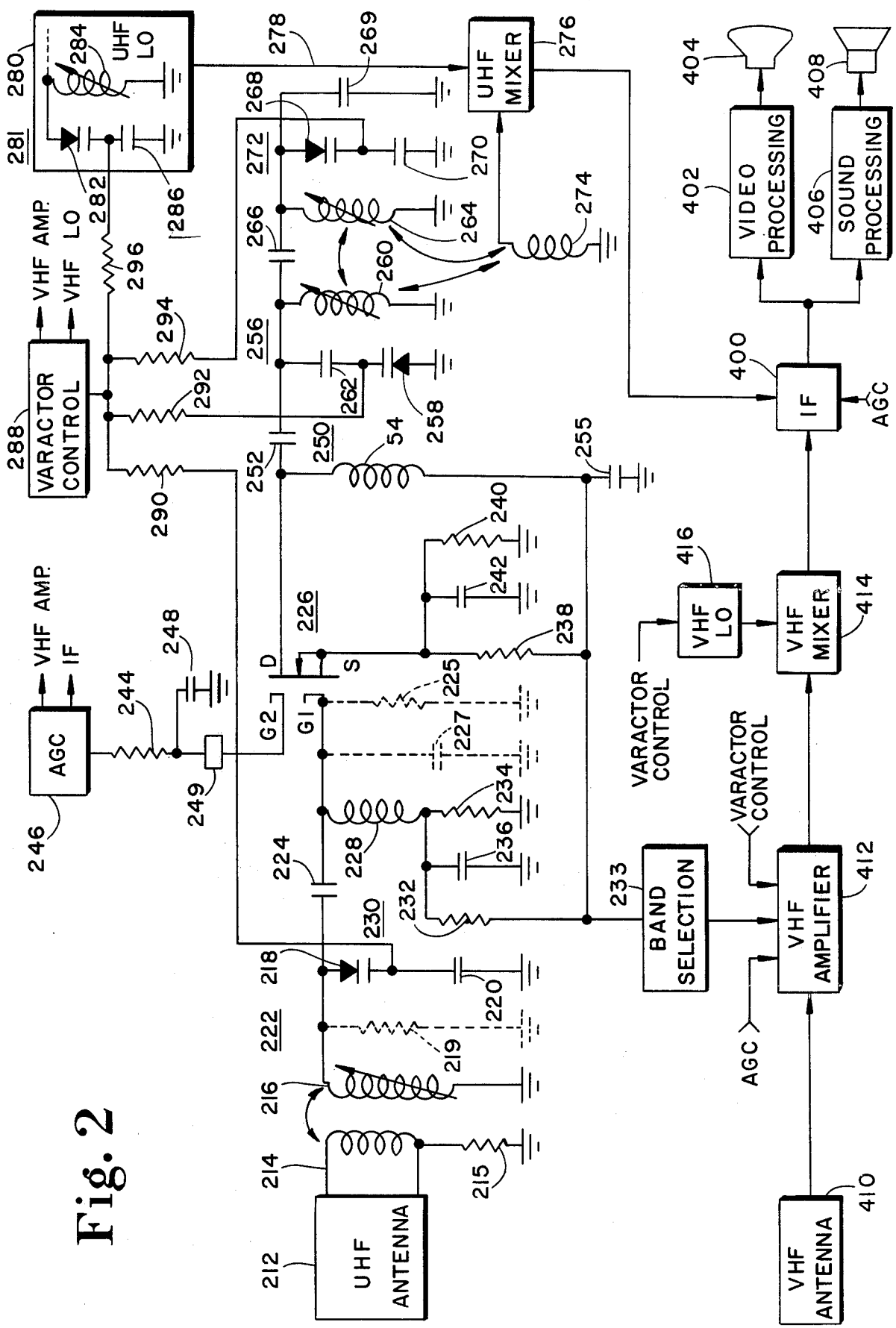
FIG. 2 is a schematic diagram of the electrical circuit formed by the printed circuit board arrangement of FIG. 1.

An electrical circuit arrangement similar to the electrical circuit of FIG. 2, corresponding to the printed circuit board arrangement of FIG. 1, is described in copending U.S. Patent Application Ser. No. 691,189 entitlted, "A UHF Tuning Circuit Utilizing a Varactor Diode", filed in the name of S. P. Knight on May 28, 1976, which is hereby incorporated by reference. The reference numbers of FIG. 1 of the Knight application have the same two least significant digits as the reference numbers in FIG. 2 of the present application.

UHF signals are received by UHF antenna network 212 and are coupled through a connector 112 to a lumped coil inductor 214. One end of inductor 214 is connected to ground conductor 116 through a resistor 215. Inductor 214 is positioned over a strip-like conductor 114 to magnetically couple signals to it. Strip-like conductor 114 has one edge which is parallel to an edge of ground conductor 116 and is spaced at a pedetermined distance from conductor 116 to form a distributed parameter inductor 216.

A slot 118 is cut, punched or otherwise formed through the board 110 in the gap between strip-like conductor 114 and ground plane 116 to improve the Q of inductor 216 at the upper end of the UHF band in a manner to be subsequently described. A tab 120 is mounted on the side of board 110 opposite the side containing the conductors. Legs 122a, 122b and 122c of tab 120 extend through corresponding slots in board 110 and are soldered to ground conductor 116. Legs 124a and 124b define the depth of insertion of legs 122a, 122b and 122c through board 110. Tab 120 is angularly positioned (i.e., bent) with respect to the plane of board 110 under slot 118 to adjust (trim) the value of the inductance of inductor 216. Legs 124a and 124b inhibit tab 120 from bending too sharply at the intersection of tab 120 and board 110 and thereby increase the number of times tab 120 may be adjusted without breaking.

A varactor diode 218 is mounted in an associated mounting slot 126 punched through board 110, having its anode lead connected to strip-like element 114 and its cathode lead (at the end identified by a band) connected to a conductive pad 127. Because varactor diode 218 is mounted in slot 126, the lengths of its leads are reduced and, as a result, the relatively difficult to control inductances normally associated with the leads are reduced. The distance between slot 118 associated with inductor 216 and slot 126 associated with varactor diode 218 determines the length of the gap between strip-like conductor 114 and ground conductor 116 and therefore determines the nominal inductance of inductor 216, as will be subsequently described.

A capacitor 220 is mounted in a slot 130 located between conductive pad 127 and ground conductor 116. Capacitor 220 comprises a dielectric material between two parallel conductive plates 128a and 128b. Plates 128a and 128b of capacitor 220 are bare and come into contact with conductive pad 127 and ground conductor 116, respectively, to which they are soldered. This mounting arrangement is desirable because component leads having inductances which are relatively difficult to control from unit to unit have been eliminated. Capacitor 220 has a trapezoidal shape to control how far it is inserted into slot 130. A TEFK7 type trapezoidal bare parallel plate capacitor manufactured by Stettner Trush Company of West Germany is suitable for use as capacitor 220.

A resistor 290 mounted on the side of board 110 opposite the conductors is coupled to pad 127 (the cathode of varactor 218) to apply control voltages developed by varactor control unit 288 to varactor 218.

A trapezoidal bar parallel plate type of capacitor 224 is mounted in a corresponding slot between strip-like conductor 114 and a conductive pad 129. A discrete air core inductor 228, mounted on the component side of board 110, is connected between pad 129 and a pad 131. Inductor 228 is utilized because it provides a higher inductance than does a distributed parameter inductance. A distributed parameter inductor could be utilized as inductor 228 but would require a larger space than does an air core inductor. A trapezoidal bar parallel plate capacitor 236 is mounted in a corresponding slot between conductor pad 131 and ground conductor 116. A gate G1 lead of a field effect transistor (FET) 226 is soldered to conductor pad 129. The circuit arrangement of capacitor 224 and inductor 228 is an impedance transformation network described in detail in the aforementioned Knight application to improve the power gain of the UHF amplifier including FET 226 at the low end of the UHF band without significantly decreasing its power gain at the upper end of the UHF band.

Bias voltage is coupled to gate G1 of FET 226 via inductor 228 and a network including discrete resistors 232 and 234, mounted on the component side of board 110 and connected to conductive pad 131 from a band selection unit 233.

FET 226 is mounted in an associated slot in board 110. A gate G2 of FET 226 is coupled through a ferrite bead 249, mounted in an associated slot near FET 226, to a conductive pad 133. Automatic gain control (AGC) voltages are coupled to gate G2 from an AGC unit 246 through a resistor 244 connected to conductor pad 133 and mounted on the component side of board 110. A trapezoidal capacitor 248 is mounted in an associated slot between conductive element 133 and ground conductor 116. Ferrite bead 249 and capacitor 248 inhibit oscillation of the amplifier including FET 226.

A source S electrode of FET 226 is coupled to a conductor pad 135. Conductor pad 135 is coupled to ground through a bare parallel plate trapezoidal capacitor 242 mounted in an associated slot between conductor 135 and ground conductor 116. Bias voltage is coupled to source S of FET 226 from band selection unit 233 through a resistor network comprising resistors 238 and 240 mounted on the component side of board 110.

The portion of the UHF tuner thus far described is enclosed by conductive metal walls 134, 140, 142 and 144. Walls 142 and 144 comprise the outer walls of the tuner assembly. The tuner assembly also has top and bottom conductive metal walls or covers 146 and 148, respectively (shown in FIG. 3). Walls 142 and 144 and covers 146 and 148 inhbit electromagnetic radiation generated within the tuner from being coupled to other portions of the receiver. They also isolate the tuner circuits from the influence of other portions of the receiver. Walls 134 and 140 divide various portions of the tuner and thereby inhibit electromagnetic radiation from one portion of the tuner from being coupled to other portions of the tuner and minimize the influence of one portion of the tuner on the electromagnetic fields of other portins of the tuner.

Wall 134 is mounted on the conductor side of printed circuit board 110 and includes legs 136a, 136b, 136c and 136d which extend downward through respective slots in board 110. Legs 136a, 136b and 136c are soldered to ground conductor 116 whenever an associated slot intersects ground conductor 116. Conductor wall 134 also includes legs 138a, 138b and 138c which come in contact with areas of the conductor side of board 110 which are free of conductors. The legs 138a, 138b and 138c keep the bottom edge of wall 134 from touching conductors on board 110 so that it may be uniformly mounted on board 110 without interference from solder on the conductors. Wall 140 is formed in a manner similar to wall 134.

The sector between wall 134 and wall 144 includes the UHF portion of the tuner while the section beyond wall 134 includes the VHF portion of the tuner. The VHF portion of the tuner (not shown in FIGS. 1 and 3) is formed by discrete components mounted on the component side of printed circuit board 110 and interconnected by conductors on the conductor side of printed circuit board 110. The VHF portion of the tuner and other portions of the receiver are shown in block diagram form in FIG. 2 with reference numbers having 4 as a most significant digit. The sector defined by walls 134 and 140 includes the first stage of the UHF portion of the tuner, that is, the circuitry up to and including drain electrode D of FET 226. On the right side of wall 140 (as shown in FIG. 1) the remaining portion of the UHF portion of the tuner, shown schematically in FIG. 2, is located. The elements indicated on the schematic diagram of FIG. 2 are readily identifiable in FIG. 1. They are not shown in the fragmentary isometric view of FIG. 3. For the most part, the elements are formed in a manner similar to that earlier described for corresponding elements of the UHF portion of the tuner on the left side of wall 140. However, some elements, such as capacitors 266 and 269 and inductors 260, 264 and 274, warrant further discussion. inductor 264, includes a T-like protrusion 141 extending from strip-like element 137 of inductor 260. The top of the T-like protrusion is spaced in a proximate and parallel relationship from an L-like protrusion 143 extending from strip-like conductor 139. Capacitor 269, coupled between inductor 264 and ground, includes an L-like protrusion 143. An inside edge of L-like protrusion 143 is spaced in a proximate and parallel relationship from ground conductor 116. The capacitances of capacitors 266 and 269 are determined by the spacings between the respective protrusions and the conductors forming the elements to which they are coupled.

Inductor 260, in addition to being capacitively coupled to inductor 264 through capacitor 266, is also magnetically coupled to inductor 264. This occurs because of the electromagnetic field which is propagated between strip-like conductor 137 of inductor 260 and strip-like conductor 139 of inductor 264 along circular field lines perpendicular to the plane of board 110 having various radii extending from an axis between strip-like conductors 137 and 139. In this manner, inductor 260 is also magnetically coupled to inductor 274. Inductor 264 is similarly coupled to inductor 274. Inductor 274 is formed by a relatively narrow conductor extending from strip-like conductor 139 of inductor 264. Unlike inductors 216, 260 and 264, inductor 274 may be considered a discrete element (rather than a distributed parameter element) since its inductance is primarily a function of its length (rather than of its proximity to ground conductor 116). That is, the inductance of inductor 274 is akin to the lead inductance normally associated with a discrete element of a thin piece of conductor deposited on a printed circuit board.

UHF local oscillator 281 is formed in a manner similar to that in which tuned circuits 222 and 256, previously described, are formed and its structure is therefore not shown.

The following description of the operation of a slotted type inductor is given with reference to inductor 216 of FIGS. 1 and 3. A similar description applied for slotted inductors 260 and 264. Slotted inductor 216 may be thought of as comprising a distributed parameter transmission line shorted to ground at one end. The equivalent circuit of the transmission line includes a plurality of serially connected inductors and a plurality of capacitors, respectively connected in shunt between the junctions of the inductors and ground. As is known, such a transmission line can be utilized either as a capacitive reactance or an inductive reactance at a particular frequency by appropriately selecting its length. Therefore, since it is desired that the combination of strip-like conductor 114 and ground conductor 116 form an inductor which is able to resonate with the capacitance of varactor diode 218 in the UHF band, the approximate length of strip-like conductor 114 (approximately the length of the gap between strip-like conductor 114 and ground conductor 116) is selected so that the transmission line is in the inductive reactance portion of its impedance versus frequency characteristic in the UHF band. The particular value of inductive reactance is determined by the exact length of strip-like conductor 114.

Since an electric field is developed between strip-like conductor 114 and ground conductor 116 in a family of increasing radii circular field lines around the longitudinal axis of the gap between strip-like conductor 114 and ground conductor 116 and perpendicular to the plane of board 110, the distributed capacitance associated with transmission line 114 is related to the width of strip-like conductor 114. Therefore, to provide the correct value of inductive reactance, it is desirable not only to select the length of strip-like conductor 114 but to also select its width in relation to the length. The relationship between the length of strip-like conductor 114 to its width is sometimes called the form factor or aspect ratio. Thus, the form factor of strip-like conductor 114 is selected to provide the appropriate value of inductance to resonate with the equivalent capacitor of the combination of varactor diode 218 and capacitor 130 to tune each channel in the UHF band.

The loss associated with inductor 126 is represented by its figure of merit Q, equal to the ratio of its inductive reactance to its equivalent series resistance at a particular frequency. To maximize the Q of inductor 216 so that is loss is minimized, it is possible to increase the width of strip-like element 114 to decrease its equivalent series resistance. However, to maintain the form factor or aspect ratio required for the desired value of inductance, this would necessitate also increasing the length of strip-like conductor 114. This is underirable since it increases the use of material and thereby undesirably increases the cost of the tuner. Furthermore, this undesirably increases the size of the tuner.

It is also possible to increase the Q or conversely lower the loss associated with inductor 216 by spacing top and bottom covers, 146 and 148, respectively, of the tuner farther apart. This is so because a portion of the electromagnetic waves propagated between strip-like conductor 114 and ground conductor 116 come in contact with top and bottom covers, 146 and 148, respectively where they generate lossy eddy current. By spacing the top and bottom covers, 146 and 148, respectively, farther apart, the portion of the electromagnetic waves passing through the covers is reduced and, as a result, the lossly eddy currents are reduced. However, this method for increasing the Q of inductor 216 is also undesirable since it increases the cost of the materials utilized for the tuner and increases its size.

The Q of inductor 216 is relatively high although strip-like conductor 114 is not unreasonably large and although top and bottom covers 146 and 148, respectively, are not unreasonably spaced far apart from each other. This is so because by cutting, punching or otherwise forming slot 118, through at least a portion of the gap between conductors 114 and 116, dielectric material is removed from the path of the electric field between strip-like conductor 114 and ground conductor 116. Dielectric material in the path of the electric field may be though of as absorbing or dissipating a portion of the energy of the field passing through it. In fact, dielectric material typically has a dissipation factor assigned to it. Therefore, by removing the lossly dielectric material by forming slot 118, the Q of inductor 216 is increased.

By way of example, the following is a tabulation of materials and dimensions associated with the formation of slotted type distributed parameter inductor 216 having a nominal inductance of approximately 7 nanohenries.

Dielectric material: G-10 type uniform mat glass epoxy available, e.g., from General Electric Company
Thickness of dielectric material: 0.032 inches
Conductor material: 2 ounce copper
Line length: Approximately 0.875 inches
Line width: Approximately 0.25 inches
Gap width: Approximately 0.040 inches
Board spacing from (both) covers: Approximately 0.5 inches
Cover material: 0.12 inch tin plated steel
Wall material: 0.036 inch cadmium plated With the materials and dimensions specified above, providing a slot approximately 0.625 inches long and having a width substantially the same as the width of the gap between conductors 114 and 116 resulted in a measured increase in Q of approximately 10% at 890

MHz (the high end of the UHF range) as compared to the Q of the same configuration without the slot. This increase in the Q of the inductor is sufficient to permit its use with a silicon type of varactor diode, such as a BB-105B diode available from International Telephone and Telegraph Company in a tuned circuit for a UHF tuner.

To furter maintain a high Q, it is desirable to keep the surface of strip-like conductor 114 relatively free of contaminants such as solder. To this end, the portions of conductor which are not to be soldered are desirably coated with a solder resistant chemical such as PC-566 transparent epoxy type solder resist available from London Chemical Company of the United States.

Not only does the removal of dielectric between strip-like conductor 114 and ground conductor 116 increase the Q of inductor 216, it also significantly improves the temperature stability characteristics of inductor 216. It is believed that this is so because the distributed capacitance associated with the transmission line formed by strip-like conductor 114 and ground conductor 116 includes components due to the capacitance between conductors 114 and 116 themselves and components due to the capacitance associated with dielectric material on which the conductors are mounted. The component of the distributed capacitance due to the dielectric has a moe influential temperature coefficient than does the distributed capacitance component due to the conductors themselves. Since the distributed capacitance of the transmission line is a factor in determining the inductance of inductor 216, by removing a component of the distributed capacitance which significantly varies with temperature with respect to other components of the distributed capaciance, the temperature stability of the transmission line is significantly improved. For example, the materials and dimensions specified above resulted in an improvement (i.e., decrease) in the temperature coefficient, measured in parts per million per centigrade degree change in temperature (PPM/°C), of approximately 40% in comparison with the temperature coefficient of the same configuration without a slot.

To further improve the temperature stability of the tuner, printed circuit board 110 is symmetrically located between top and bottom covers 146 and 148, respectively. This is so because when board 110 is symetrically mounted between the covers, if it deflects in one direction, for example, toward top cover 146, due to mechanical stresses brought about by a temperature change, the changes in the capacitances between the conductors and top cover 146 will be approximately equal but opposite to changes in the capacitances between the conductors and bottom cover 148. As a result, the capacitane changes substantially cancel one another. If, on the other hand, printed circuit board 110 were asymmetrically located between top and bottom covers 146, and 148, respectively, the changes in capacitances between the conductors and top cover 146 and the capacitances between the conductors and bottom cover 148 would not be equal and therefore would not cancel each other.

As earlier mentioned, the length of strip-like conductor 114 is substantially determined by the length of the gap between conductor 114 and conductor 116. In the absence of slot 118, the length of the gap is determined at one end (the lower end in FIG. 1) by the photographic mask which determines the location of the conductors on board 110 and at the other end (the upper end in FIG. 1) by the die which is used to cut or punch out mounting sot 126 associated with varactor diode 218. Because there are registration errors in aligning a circuit board and an associated die, the length of th gap between a strip-like conductor such as 114 and a ground conductor such as 116 would normally tend to vary from work piece to work piece. However, because slot 118 is cut or punched in the gap to increase the Q and improve the temperature stability of inductor 216, the variation in the length of the line from work piece to work piece may also be reduced. When slot 118 is utilized to form inductor 216, the bottom end of the gap between conductors 114 and 116 is determined by the die associated with slot 118 since it defines where the conductor material is cut away between conductors 114 and 116. That is, before the punching operation, there is conductor material in a portion of the area between the top and bottom ends of the gap between conductors 114 and 116. This conductor material, as well as the dielectric beneath it, is punched to form slot 118 and, as a result, defines the bottom end of the gap. The top end of the gap is defined when slot 126 is punched out. Thus, if a unitary die is utilized to punch out all the slots in the printed circuit board, a registration error between board 110 and an associated die causing, for example, an upward shift of the location of the bottom end of the gap will cause a corresponding upward shift of the location of the top end of the gap. Therefore, the length of the gap will be relatively uniform from work piece to work piece.

The value of inductance of inductor 216 is adjusted or trimmed by controlling the angular position of trimmer tab 120 over slot 118 and strip-like conductor 114. The angular positioning of trimmer tab 120 changes the electromagntic path associated with inductor 216. The closer tab 120 is brought to the plane of printed circuit board 110, that is, the more acute the angle tab 120 makes with the plane of printed circuit board 110, the lower the value of the inductance of inductor 216. This may be explained by considering that the distributed capacitance associated with inductor 216 increases as tab 120 is brought closer to strip-like conductor 114. As a result, the effective inductance of the line decreases. With the materials and dimensions specified above, a 20% decrease in inductance was found to be readily achievable by the adjustment of tab 120. Other types of trimming devices may be employed, for example, a wire loop type inductance trimmer such as is described, for example, in the aforementioned U.S. Pat. No. 3,806,844, may be utilized. However, the tab type trimmer is desirably utilized since it has substantially less loss associated with it than does a wire loop type of inductance trimmer. This is so because a wire loop trimmer absorbs energy by inductive coupling and dissipates it in its own internal resistance while a tab type trimmer operates by changing the fields of the associated inductor.

Thus, a printed circuit board has been desciribed which may be utilized in the tunner of a television receiver. Discrete components for both the VHF and UHF portions may be readily mounted on one side of the board while conductors for interconnecting the discrete components and for forming distributed types of inductors and capacitors are mounted on the other side. This arrangement is relatively simple (and inexpensive) to manufacture compared to other types of tuner structures, such as, for example, a punched metal chassis type of structure, since it allows for efficient mounting and wave soldering of components, readily permits any necessary design changes by means of photographic mask changes and utilizes relatively inexpensive materials. Moreover, a printed circuit board type of structure ensures relative uniformity from work piece to work piece because components can be accurately located in it.

Although the present tuner structure has been described in terms of a single-sided printed circuit board, conductors may be mounted on both sides of the board although this is less desirable in terms of material and assembly cost. For example, components may be mounted on a single side printed circuit board by means of automatic component insertion machines. Nevertheless, the present invention is not intended to be limited to printed circuit boards having conductors solely on one side. These and other modifications are intended to be within the scope of the present invention.

What is claimed is:

1. In a tuner, the combination comprising:
 a printed circuit board including a slab of dielectric material having conductors formed on one side thereof;
 a first of said conductors having an edge and being coupled to a source of fixed potential;
 a strip-like conductor having an edge parallel to the edge of said first conductor and spaced at a proximate distance therefrom to define a gap between said conductors, said strip-like conductor being connected at one end thereof to said first conductor, said strip-like conductor having a length and width selected to provide an inductive reactance in the UHF band;
 said printed circuit board having a slot formed therethrough in an area including at least a portion of said gap, a portion of said first conductor and a portion of said strip-like conductor to define the position of said one end of said strip-like conductor;
 said printed circuit board having a component mounting aperture formed therethrough in an area including another portion of said strip-like conductor to define the position of the other end of said strip-like conductor;
 a discrete component mounted in said component mounting aperture; and
 at least another discrete component mounted on the side of said printed circuit board opposite said conductors having leads thereof connected to respective ones of said conductors.

2. The combination recited in claim 1 wherein a tab is mounted on said circuit board to be angularly positioned with respect to the plane of said circuit board in juxtaposed relationship with said strip-like conductor to control the value of said inductive reactance.

3. The combination recited in claim 1 wherein an inductive coil is proximately located with respect to said strip-like conductor to magnetically couple signals thereto.

4. The combination recited in claim 1 wherein one of said leads of said discrete component mounted in said component mounting aperture is connected to said strip-like conductor and wherein said discrete component mounted in said component mounting aperture has a capacitive reactance associated therewith, said discrete component mounted in said component mounting aperture and said strip-like conductor comprising a tuned circuit having a resonant frequency in the UHF band.

5. The combination recited in claim 4 wherein said discrete component mounted in said component mounting apertue is a varactor diode.

6. The combination recited in claim 5 wherein a bare parallel plate capacitor is mounted in a second component mounting aperture in said printed circuit board between two of said conductors, one of said two conductors being coupled to the other lead of said varactor diode.

7. A tuned circuit for a television tuner comprising:
 a circuit board including a slab of dielectric material having conductors mounted on one side thereof;
 a first of said conductors having an edge and being coupled to a source of fixed potential;
 a strip-like conductor having an edge parallel to the edge of said first conductor and spaced at a proximate distance therefrom to define a gap between said conductors, said strip-like conductor being connected at one end thereof to said first conductor said strip-like conductor having a length and width selected to provide an inductive reactance in the UHF band;
 said circuit board having a slot located in said gap between said first conductor and said strip-like conductor;
 a mounting slot positioned with respect to said slot in said gap to determine the length of said strip-like conductor;
 a varactor diode mounted in said mounting slot and having one lead thereof coupled to said strip-like conductor;
 a second conductor adjacent to said mounting slot, said varactor diode having a second lead thereof coupled to said second conductor;
 a second mounting slot located between said second conductor from said first conductor; and
 a bare parallel plate capacitor mounted in said second mounting slot having plates thereof respectively coupled to said first and second conductors.

8. The combination recited in claim 7 wherein an inductive coil is proximately located with respect to said strip-like conductor to magnetically couple signals thereto.

9. The combination recited in claim 7 wherein a tab is coupled to said first conductor and mounted on said circuit board to be angularly positioned with respect to the plane of said circuit board in juxtaposed relationship with said slot in said gap and said strip-like conductor to control the value of the inductive reactance associated with said strip-like conductor.

10. The combination recited in claim 7 wherein said bar parallel plate capacitor has a generally trapezoidal cross-section.

* * * * *

UNITED STATES PATENT OFFICE
CERTIFICATE OF CORRECTION

PATENT NO. : 4,048,597

DATED : September 13, 1977

INVENTOR(S) : Stanley Paul Knight, et al.

It is certified that error appears in the above-identified patent and that said Letters Patent are hereby corrected as shown below:

Column 3, line 28, that portion reading "bar" should read -- bare --; line 37, that portion reading "bar" should read -- bare --; Column 4, line 20, that portion reading "portins" should read -- portions --; line 36, that portion reading "section" should read -- sector --; line 59, after "discussion." and before "inductor 264" insert -- ¶ Capacitor 266, coupled between inductor 260 and --; Column 6, line 28, that portion reading "lossly" should read -- lossy --; line 42, that portion reading "though" should read -- thought --; line 45, that portion reading "lossly" should read -- lossy --; Column 7, line 27, that portion reading "moe" should read -- more --; line 68, that portion reading "sot" should read -- slot --; Column 8, line 2, that portion reading "th" should read -- the --; Column 10, line 8, that portion reading "apertue" should read -- aperture --; line 58, that portion reading "bar" should read -- bare --.

Signed and Sealed this

Twenty-first Day of February 1978

[SEAL]

Attest:

RUTH C. MASON
Attesting Officer

LUTRELLE F. PARKER
Acting Commissioner of Patents and Trademarks